United States Patent
Xue et al.

(10) Patent No.: US 9,449,133 B2
(45) Date of Patent: Sep. 20, 2016

(54) PARTITION BASED DESIGN IMPLEMENTATION FOR PROGRAMMABLE LOGIC DEVICES

(71) Applicant: Lattice Semiconductor Corporation, Hillsboro, OR (US)

(72) Inventors: Hua Xue, Saratoga, CA (US); Mohan Tandyala, San Jose, CA (US); Nilanjan Chatterjee, Cupertino, CA (US); Venkatesan Rajappan, Fremont, CA (US)

(73) Assignee: LATTICE SEMICONDUCTOR CORPORATION, Portland, OR (US)

( * ) Notice: Subject to any disclaimer, the term of this patent is extended or adjusted under 35 U.S.C. 154(b) by 208 days.

(21) Appl. No.: 14/271,955

(22) Filed: May 7, 2014

(65) Prior Publication Data

US 2015/0324509 A1 Nov. 12, 2015

(51) Int. Cl.
G06F 17/50 (2006.01)

(52) U.S. Cl.
CPC ......... *G06F 17/5054* (2013.01); *G06F 17/505* (2013.01); *G06F 17/5072* (2013.01); *G06F 17/5077* (2013.01)

(58) Field of Classification Search
CPC ........... G06F 17/5054; G06F 17/5077; G06F 17/5072; G06F 17/505
See application file for complete search history.

(56) References Cited

U.S. PATENT DOCUMENTS

| | | | |
|---|---|---|---|
| 7,086,029 B1 | 8/2006 | Barras et al. | |
| 7,191,426 B1 | 3/2007 | Singh et al. | |
| 7,290,240 B1* | 10/2007 | Lam-Leventis | G06F 17/5068 716/104 |
| 7,490,312 B1 | 2/2009 | Ochotta et al. | |
| 7,536,661 B1* | 5/2009 | Singh | G06F 17/5072 716/104 |
| 7,590,951 B1 | 9/2009 | Bell, II et al. | |
| 7,620,927 B1 | 11/2009 | Ochotta et al. | |
| 7,707,536 B2* | 4/2010 | Lin | G06F 17/5077 716/126 |
| 8,060,845 B2 | 11/2011 | Herzl et al. | |
| 8,196,083 B1 | 6/2012 | Kong | |
| 8,250,505 B1 | 8/2012 | Borer et al. | |
| 8,296,695 B1* | 10/2012 | Chen | G06F 17/505 703/16 |
| 8,327,304 B2* | 12/2012 | Moffitt | G06F 17/5027 716/106 |
| 9,021,409 B2* | 4/2015 | Vasudevan | G06F 17/504 716/106 |

(Continued)

OTHER PUBLICATIONS

Lattice Semiconductor, "Design Planning", http://www.latticesemi.com/~/media/Documents/UserManuals/1D/design_planning_document.pdf, Jun. 2012, 52 pages.

(Continued)

*Primary Examiner* — Naum B Levin

(57) ABSTRACT

Various techniques are provided to generate designs for programmable logic devices (PLDs). In one example, a computer-implemented method includes selectively grouping a first plurality of logic components for a first design into a plurality of partitions. The method also includes selectively merging at least a subset of the partitions of the first design. The method also includes converting each partition into a corresponding first physical implementation for a PLD. The method also includes comparing the first plurality of logic components to a second plurality of logic components for a second design to identify changed and unchanged partitions. The method also includes converting each changed partition into a corresponding second physical implementation for the PLD. The method also includes combining the first physical implementations for the unchanged partitions, with the second physical implementations for the changed partitions.

19 Claims, 6 Drawing Sheets

(56) References Cited

U.S. PATENT DOCUMENTS

2005/0129348 A1* 6/2005 Iwasaki ............... G06F 17/5045
    385/14
2009/0183134 A1* 7/2009 Herzl .................. G06F 17/5045
    716/119

OTHER PUBLICATIONS

Lattice Semiconductor, "Incremental Design Flow User Guide", http://help.latticesemi.com/docs/manuals/inc_design_usr_guide.pdf, Apr. 2013, 54 pages.

\* cited by examiner

PARTITION BASED DESIGN IMPLEMENTATION FOR PROGRAMMABLE LOGIC DEVICES

TECHNICAL FIELD

The present invention relates generally to programmable logic devices and, more particularly, to the generation of user designs implemented in such devices.

BACKGROUND

Programmable logic devices (PLDs) (e.g., field programmable gate arrays (FPGAs), complex programmable logic devices (CPLDs), field programmable system on a chips (FPSCs), or other types of programmable devices) may be configured with various user designs to implement desired functionality. Typically, a multi-step process is used to implement the user design in the PLD. In some cases, this process includes the steps of synthesis, mapping, placement, and routing. These steps can consume extensive processing resources—especially the mapping, placement, and routing steps which collectively determine the physical implementation of the user design in the PLD.

Because the user design becomes highly optimized for the PLD through this process, subsequent changes to the user design (e.g., enhancements, improvements, or corrections) can significantly impact the final implementation of the user design in the PLD. Thus, if changes to the user design are required, conventional processes require most or all of the process steps to be repeated (e.g., rerun) which can incur significant processing time and resources. Unfortunately, as PLD sizes continue to grow, this processing is compounded.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to efficiently implement user designs in programmable logic devices (PLDs). In some embodiments, a design is synthesized into an initial netlist. The initial netlist is segmented into a plurality of partitions that are selectively combined (e.g., merged) with each other to obtain a final set of partitions. Each partition is mapped, placed, and routed for implementation in the PLD, with the mapping, placement, and routing results stored for each partition.

Following a change to the design, the revised design is synthesized into a revised netlist that is compared with the initial netlist to identify changed and unchanged partitions. For unchanged partitions, the previously stored mapping, placement, and routing data is reused. For changed partitions, corresponding portions of the revised netlist are segmented into new partitions which are mapped, placed, and routed.

As a result of this partition-based approach, processing-intensive mapping, placement, and routing operations need not be performed again for unchanged partitions of the design. Such techniques can reduce overall processing time and processing load when the design is revised.

Figure 1:
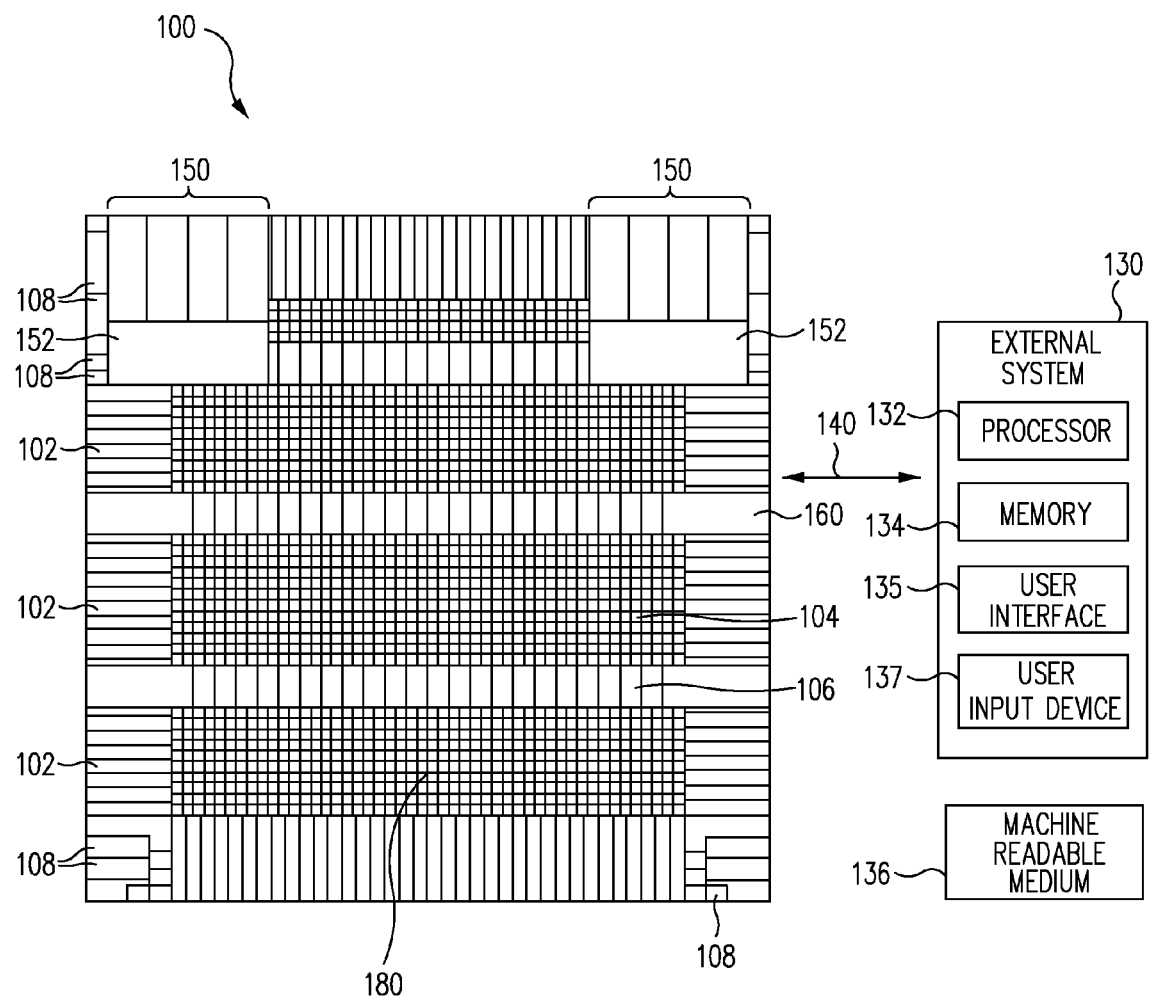
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 also includes hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, I/O blocks 102 may be used for programming PLD 100, such as memory 106 or transferring information (e.g., various types of data and/or control signals) to/from PLD 100 through various external ports as would be understood by one skilled in the art. I/O blocks 102 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation of Hillsboro, Oreg. to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
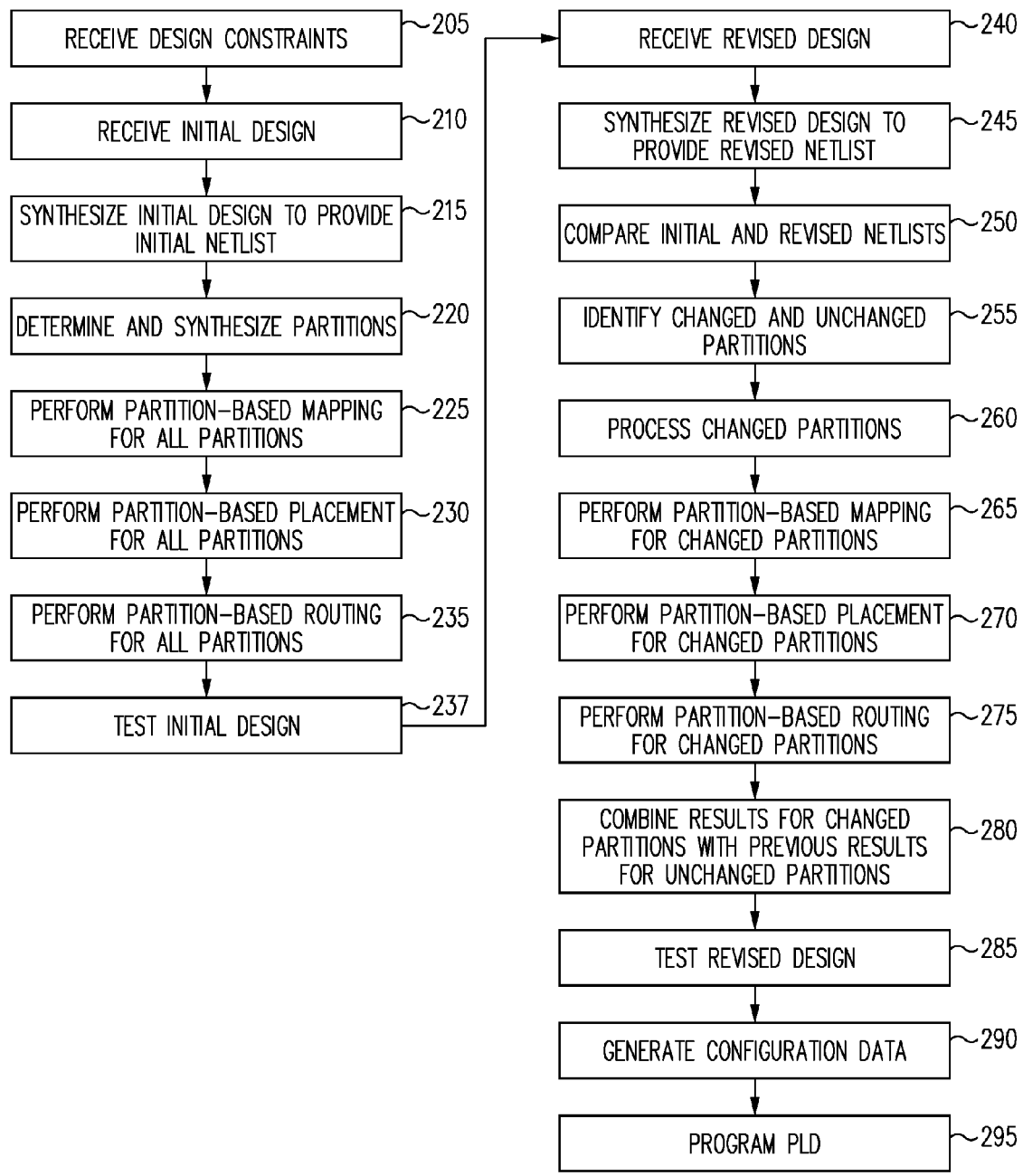
FIG. 2 illustrates a design process for a PLD in accordance with an embodiment of the disclosure.

FIG. 2 illustrates a design process for a PLD in accordance with an embodiment of the disclosure. For example, the process of FIG. 2 may be performed by system 130 running Lattice Diamond software to configure PLD 100. In some embodiments, the various files and information referenced in FIG. 2 and FIG. 3 (further described herein) may be stored, for example, in one or more databases and/or other data structures in memory 134, machine readable medium 136, and/or otherwise.

In operation 205, system 130 receives one or more constraints for the design to be implemented by PLD 100. For example, a user may interact with system 130 (e.g., through user input device 137) to identify timing requirements, critical (e.g., time sensitive) inputs and signal paths, area requirements, and/or other constraints that are desired or required to be met by the design process of FIG. 2.

In operation 210, system 130 receives an initial design that specifies the desired functionality of PLD 100. For example, the user may interact with system 130 (e.g., through user input device 137 and hardware description language (HDL) code representing the design) to identify various features of the initial design (e.g., high level logic operations, hardware configurations, and/or other features). In some embodiments, the initial design may be provided in a register transfer level (RTL) description (e.g., a gate level description). System 130 may perform one or more rule checks to confirm that the initial design describes a valid configuration of PLD 100. For example, system 130 may reject invalid configurations and/or request the user to provide new design information as appropriate.

In operation 215, system 130 synthesizes the design to create an initial netlist (e.g., a synthesized RTL description) identifying an abstract logic implementation of the initial design as a plurality of logic components (e.g., also referred to as netlist components). In some embodiments, the netlist may be stored in Electronic Design Interchange Format (EDIF) in a Native Generic Database (NGD) file.

In operation 220, system 130 determines and synthesizes a plurality of partitions for the initial netlist. In this regard, the various components specified by the netlist may be segmented into a plurality of partitions (e.g., sets or groups of components) which are selectively adjusted to optimize performance. As further described herein, the design may be mapped, placed, and routed in a partition-based manner to permit reuse of the mapping, placement, and routing results for desired partitions that remain unchanged after a subsequent design revision.

Figure 3:
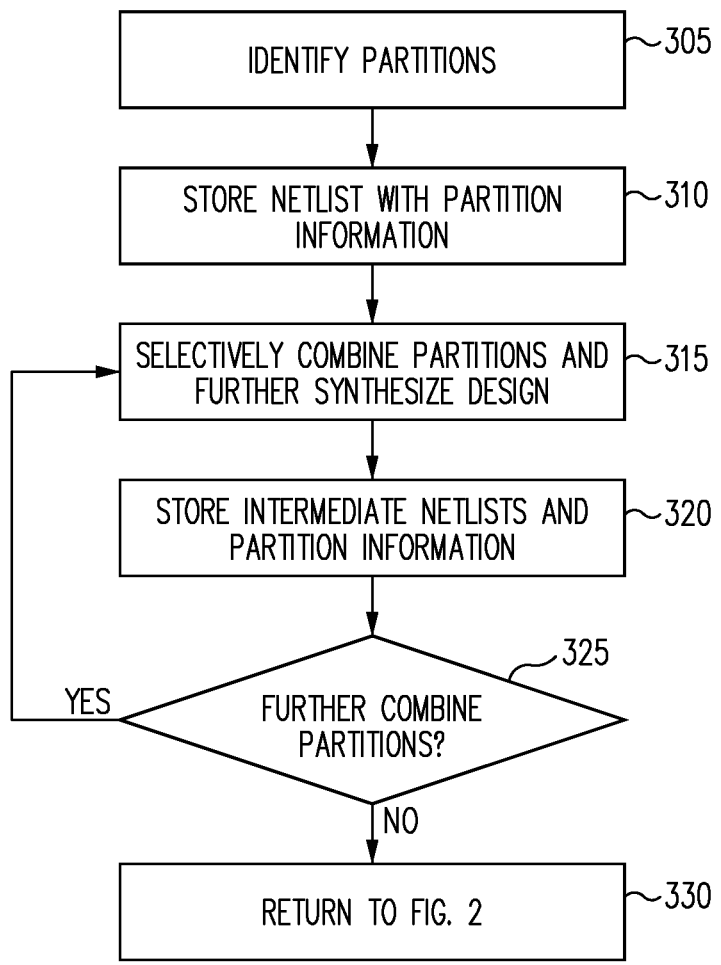
FIG. 3 illustrates a partition adjustment process for a PLD in accordance with an embodiment of the disclosure.

For example, FIG. 3 illustrates a partition adjustment process for PLD 100 in accordance with an embodiment of the disclosure. In some embodiments, the process of FIG. 3 may be performed by system 130 running Lattice Diamond software during operation 220 of FIG. 2.

Referring now to FIG. 3, in operation 305, system 130 identifies an initial set of partitions. For example, in some embodiments, each individual component of the initial netlist may be associated with its own partition.

Figure 4A:
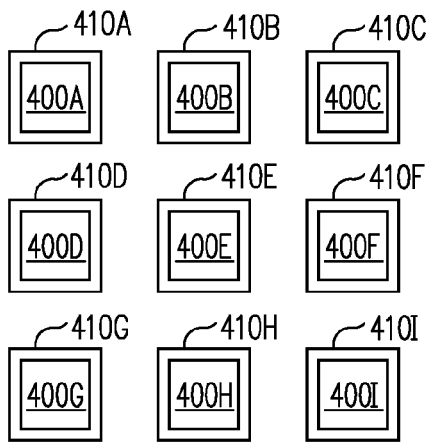
FIGS. 4A-F, 5A-B, and 6A-B illustrate various example partitions in accordance with embodiments of the disclosure.

For example, FIG. 4A illustrates an example set of components 400A-I shown in a generic fashion, each of which is associated with a corresponding partition 410A-I. Although only nine components 400A-I and nine partitions 410A-I are shown in this example, PLD 100 may include many thousands of components or partitions, or any desired number, in various embodiments.

In operation 310, system 130 stores the initial netlist with its associated initial partition information for subsequent recall. In operation 315, system 130 selectively combines (e.g., merges) various partitions and further synthesizes the components therein to satisfy the user design constraints previously identified in operation 205. In various embodiments, partitions may be combined to group together components where it may be beneficial to perform further synthesis to improve timing, reduce area, or conform with other design constraints.

Figure 5A:
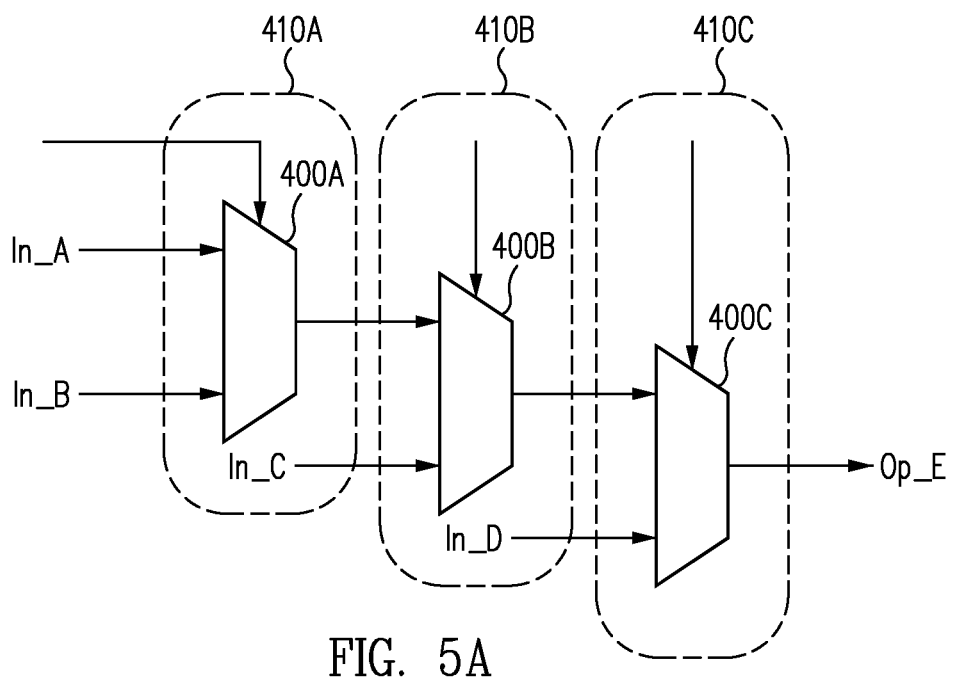

In this regard, FIG. 5A illustrates components 400A-C which are implemented, in this example, as multiplexers. As shown, components 400A-C are associated with respective partitions 410A-C. Components 400A-C provide a critical path from signal In_A to signal Op_E which passes through three multiplexers in FIG. 5A.

Figure 4B:
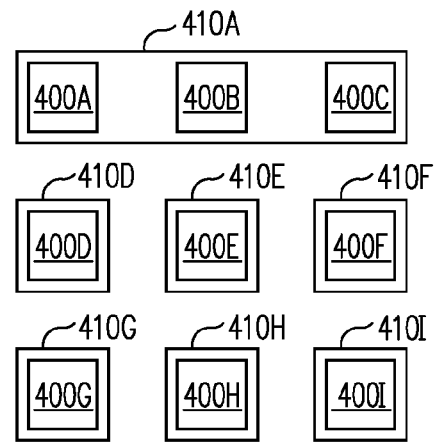
Figure 5B:
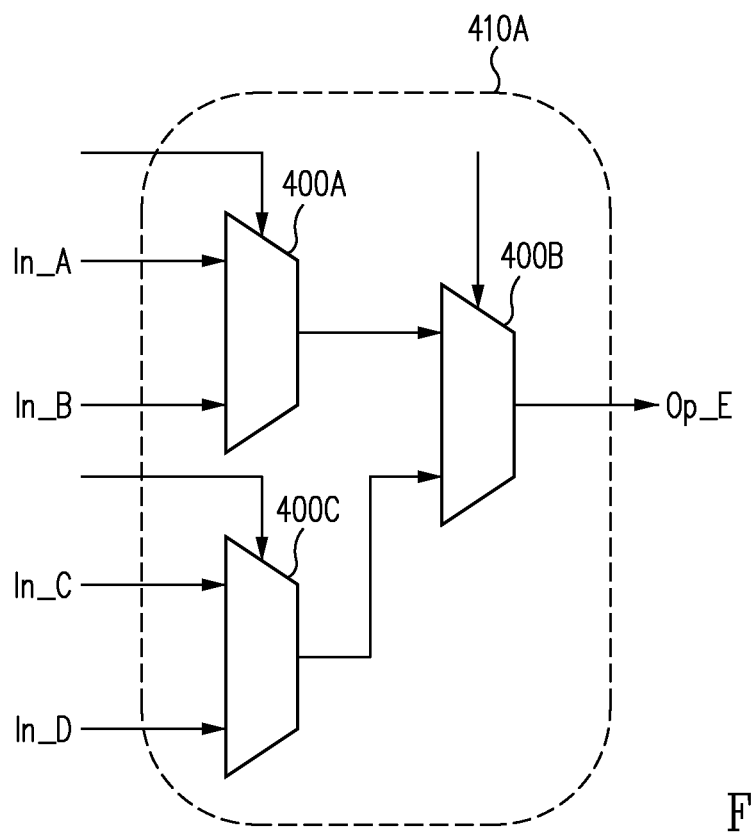

FIG. 5B illustrates components 400A-C after they have been merged into a single partition 410A which has been synthesized to reduce the length of the critical path. In particular, the critical path from signal In_A to signal Op_E passes through only two multiplexers in FIG. 5B, thus improving the timing of the critical path. This is further shown conceptually in FIG. 4B which illustrates components 400A-C merged into a single partition 410A.

Figure 4C:
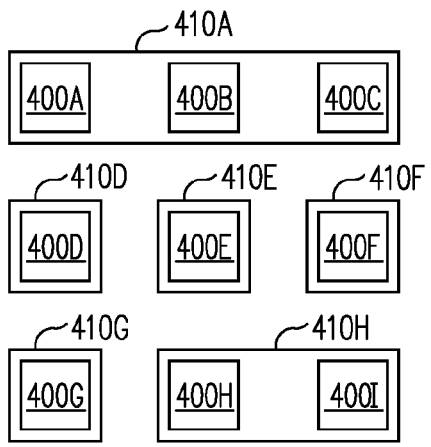
Figure 6A:
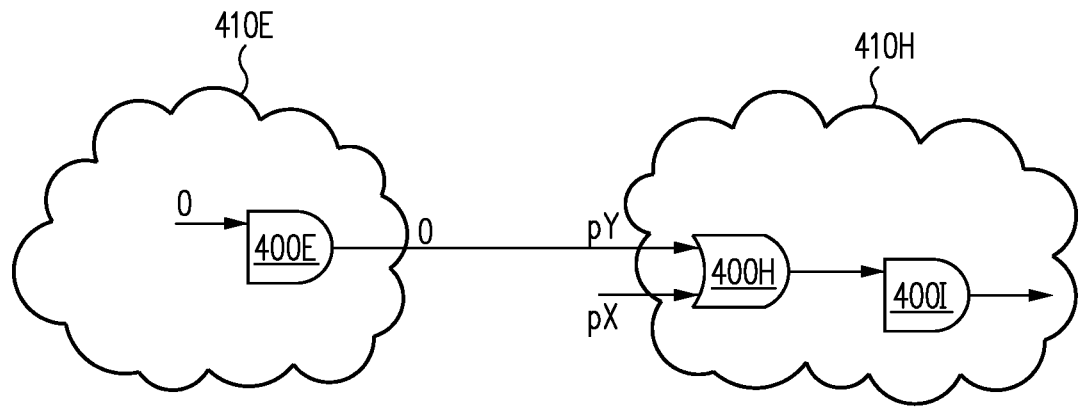

As another example, FIG. 6A illustrates components 400E, 400H, and 400I implemented, in this example, as logic gates. As shown, component 400E is associated with partition 410E and provides a constant output value. Components 400H and 400I are associated with partition 410H (e.g., partitions 410H and 410I may have been merged together in a previous iteration of the loop provided by operations 315, 320, and 325 further described herein). This is further shown conceptually in FIG. 4C which illustrates components 400H and 400I in partition 410H.

Figure 4D:
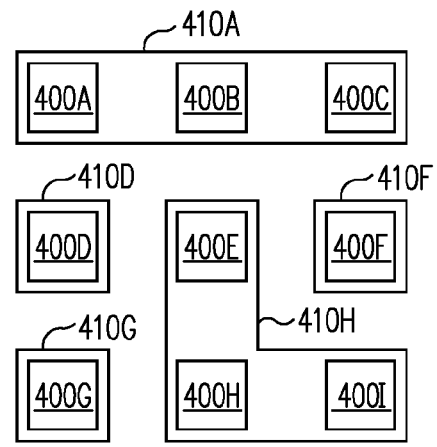
Figure 6B:
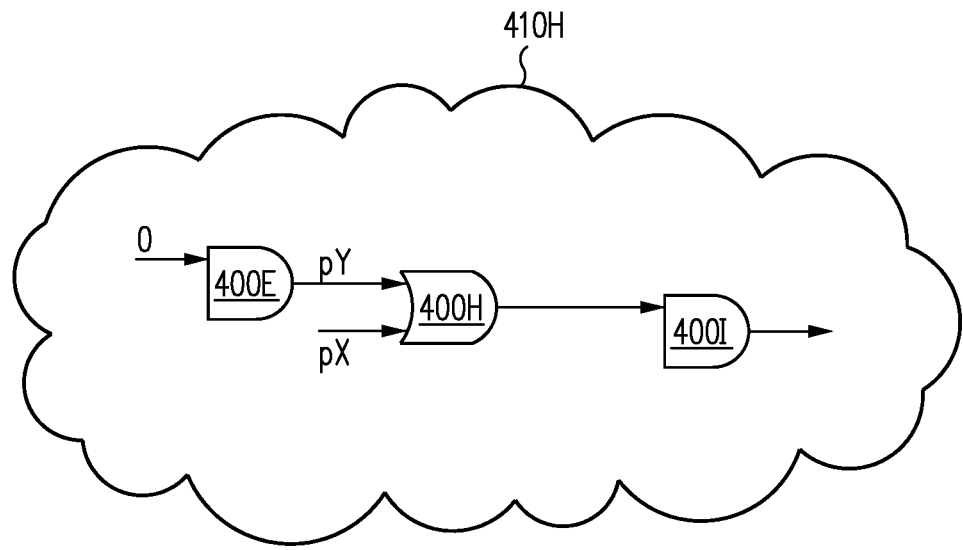

FIG. 6B illustrates components 400E, 400H, and 400I after they have been merged into a single partition 410H during operation 315. In this regard, the constant provided by component 400E has been propagated to partition 410H. When partition 410H is subsequently mapped, placed, and routed (e.g., during subsequent operations in the process of FIG. 2), components 400E, 400H, and 400I may be implemented nearby each other to reduce the overall area of PLD 100 used to implement the design. Thus, by combining partitions 410E and 410H into a single partition 410H, the overall area used to implement the design may be reduced. This is further shown conceptually in FIG. 4D which illustrates components 400E, 400H, and 400I merged into a single partition 410H.

The partition merging processes described for FIGS. 5A-B and 6A-B are merely examples. Partitions with larger numbers of components (e.g., hundreds or thousands of components) may be selectively merged in various embodiments.

Returning to FIG. 3, in operation 320, system 130 stores intermediate netlists and partition information for the various components synthesized during operation 315. For example, the associations between each of components 400A-I and their currently associated partitions 410A-I for each iteration of operation 315 may be stored for subsequent recall. As a result, if the user design subsequently changes (e.g., resulting in changes to one or more of components 400A-I), system 130 may determine which partitions 410A-I would be affected by such changes.

In operation 325, system 130 determines whether to combine additional partitions. If yes, then the process returns to operation 315 for another iteration. Otherwise, the process returns to FIG. 2 (operation 330). System 130 may use various criteria to make the determination in operation 325. For example, in some embodiments, system 130 may choose to stop combining partitions if a maximum allowable partition size (e.g., corresponding to a maximum number of components and/or signals which may be associated with each partition) has been reached. In some embodiments, system 130 may choose to stop combining partitions if partition boundaries have not changed (e.g., no partitions have been combined) in the current iteration of operation 315. Other criteria may be used as desired.

Figure 4E:
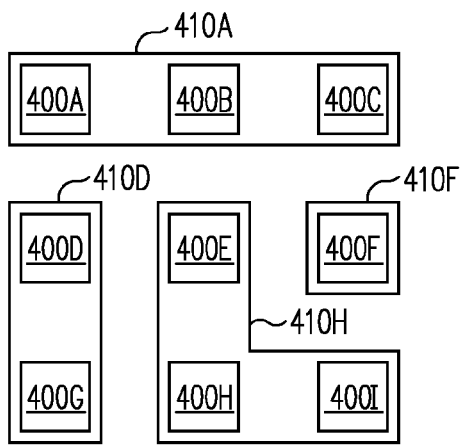
Figure 4F:
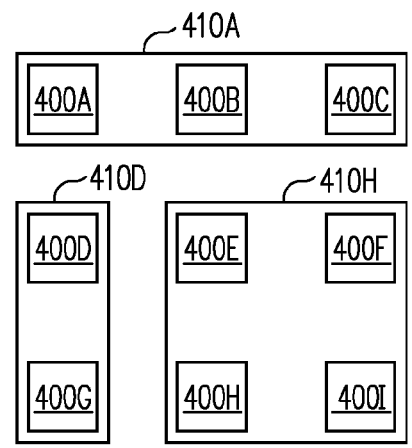

FIGS. 4E-F illustrate the results of additional iterations of operation 315. For example, in FIG. 4E, partitions 410D and 410G have been combined together into partition 410D. In FIG. 4F, partitions 410F and 410H have been combined together into partition 410H. Thus, in this example, the process of FIG. 3 results in three partitions 410A, 410D, and 410H having various numbers of associated components. As discussed, significantly larger numbers of partitions and associated components are also contemplated.

Referring again to FIG. 2, in operations 225, 230, and 235, system 130 performs mapping, placement, and routing operations, respectively, to convert the abstract logic implementation of the initial design into a physical implementation for PLD 100. Operations 225, 230, and 235 may be performed in a partition-based manner (e.g., to permit reuse of the results of such operations for unchanged partitions in a revised user design).

For example, in operation 225, system 130 performs a mapping process that identifies components of PLD 100 that may be used to implement the initial design. In this regard, system 130 may map the RTL description for the current netlist (e.g., stored in operation 320) to various types of components provided by PLD 100 (e.g., logic blocks, embedded hardware, and/or other portions of PLD 100) and their associated signals (e.g., in a logical fashion, but without yet specifying placement or routing). The mapping may be performed in a partition-based manner, such that discrete sets of components are mapped for each partition. In some embodiments, the mapping may be performed on one or more previously-stored NGD files, with the mapping results stored as a physical design file (e.g., also referred to as an NCD file).

In operation 230, system 130 performs a placement process to assign the mapped netlist components to particular physical components residing at specific physical locations of the PLD 100 (e.g., assigned to particular logic blocks 104 and/or other physical components of PLD 100), and thus determine a layout for the PLD 100. The placement may be performed in a partition-based manner, such that discrete sets of physical PLD components are mapped for each partition. In some embodiments, the placement may be performed on one or more previously-stored NCD files, with the placement results stored as another physical design file.

In operation 235, system 130 performs a routing process to route connections (e.g., using routing resources 180) among the components of PLD 100 based on the placement layout determined in operation 230 to realize the physical interconnections among the placed components. The routing may be performed in a partition-based manner, such that the routed signal data is annotated with partition information for reuse in subsequent operations in the design process of FIG. 2 (e.g., following a change to the user design). In some embodiments, the routing may be performed on one or more previously-stored NCD files, with the routing results stored as another physical design file.

Thus, following operation 235, one or more physical design files may be provided which specify the initial user design after it has been synthesized, mapped, placed, and routed for PLD 100 (e.g., by combining the results of the corresponding previous operations). In operation 237, system 130 tests the design (e.g., by performing a timing analysis and simulation of the physical design implementation). Thus, the quality and performance of the implemented design may be determined. System 130 may display results of the analysis and simulation to the user (e.g., on user interface 135), and the user may confirm the results of the design.

In some embodiments, the user may revise the initial design to correct errors, improve, expand, and/or simplify the initial design. As a result, the user may provide a revised design which is received by system 130 in operation 240 (e.g., in the same or similar format as in operation 210, such as an RTL description).

In operation 245, system 130 synthesizes the revised design to create a revised netlist identifying an abstract logic implementation of the revised design (e.g., in the same or similar format as in operation 215, such as: an RTL description).

In operation 250, system 130 compares the initial netlist (determined in operation 215) with the revised netlist (determined in operation 245). In this regard, the initial and revised netlists may be substantially identical or may have significant differences, depending on the changes implemented in the revised design.

In operation 255, system 130 uses the netlist comparison results to identify changed and unchanged partitions. As discussed with regard to operations 310 and 320, system 130 stores the initial netlist and the intermediate netlists along with their associated partition information. As a result, system 130 can identify which of the previously-identified partitions are unchanged in the revised design (e.g., which of the previously-identified partitions correspond to portions of the revised netlist that have not changed in the revised design). Because the previously discussed mapping, placement, and routing operations 225, 230, and 235 were performed on a partition-by-partition basis, the results of such operations may be reused to map, place, and route the portions of the revised netlist corresponding to the unchanged partitions. Thus, because system 130 is not required to re-map, re-place, or re-route such portions of the revised netlist, the processing time and resources used for the revised design can be greatly reduced, even when changes are made at an abstract RTL description level.

For example, if the revised netlist resulted in a change to only component 400G, this would only affect partition 410D (see FIG. 4F). Meanwhile, while components 400A-C, 400E-F, and 400H-I of the remaining partitions 410A and 410H would remain unchanged. As a result, partitions 410A and 410H would be considered unchanged partitions, and partition 410D would be considered a changed partition. Thus, only the portion of the revised netlist corresponding to components 400D and 400G would be reprocessed for the revised design.

Accordingly, in operation 260, system 130 processes the portions of the revised netlist corresponding to the changed partitions in the manner previously described in operation 220. In this regard, system 130 performs the process of FIG. 3 again, but only on the portions of the revised netlist corresponding to the changed partitions (e.g., a subset of the revised netlist). Thus, system 130 may create new initial partitions for the subset of the revised netlist and selectively combine the partitions to determine a new set of partitions for the subset of the revised netlist. Continuing the example above, components 400D and 400G would initially each be associated with their own partitions which may then be selectively combined in the process of FIG. 3.

In operations 265, 270, and 275, system 130 performs partition-based mapping, placement, and routing operations in the manner of operations 225, 230, and 235, respectively, but only on the new set of partitions for the subset of the revised netlist.

In operation 280, system 130 combines the previous placement and routing results for the unchanged partitions (e.g., determined in operations 230 and 235) with the new placement and routing results for the new partitions (e.g., determined in operations 270 and 275) to provide one or more final physical design files.

Continuing the example above, the previous placement and routing results for unchanged partitions 410A and 410H may be combined with the new placement and routing results for the one or more new partitions associated with components 400D and 400G.

Thus, following operation 280, the revised user design has been synthesized, mapped, placed, and routed for PLD 100, but without requiring re-synthesis, re-mapping, re-placement, or re-routing for portions of the design corresponding to unchanged partitions.

In operation 285, system 130 tests the revised design in the manner of operation 237. In operation 290, system 130 generates configuration data for the revised design. In operation 295, system 130 configures PLD 100 with the configuration data such as, for example, loading a configuration data bitstream into PLD 100 over connection 140.

Thus, in view of the present disclosure, it will be understood that mapping, placement, and routing results for unchanged portions of a design can be reused, thus saving significant time and processing resources. Moreover, as discussed, many operations of FIGS. 2 and 3 may be performed by system 130. Such operations do not require user input. For example, the user is not required to proactively identify partitions that will not be changed in revised designs. As a result, the user can quickly and conveniently revise a design at an RTL description level without having to track partitions associated with changing components.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method comprising:
    obtaining a first design comprising a first plurality of logic components, the first design comprising an RTL description;
    selectively grouping the first plurality of logic components for the first design into a plurality of partitions;
    selectively merging at least a subset of the partitions of the first design;
    converting each partition into a corresponding first physical implementation for a programmable logic device (PLD);
    obtaining a second design comprising a second plurality of logic components, the second design comprising an RTL description;
    comparing the first plurality of logic components to the second plurality of logic components for the second design, the comparing comprising comparing the RTL descriptions of the first design and the second design, to identify changed and unchanged partitions between the first design and the second design;
    converting each changed partition into a corresponding second physical implementation for the PLD; and
    combining the first physical implementations for the unchanged partitions with the second physical implementations for the changed partitions, wherein the method is implemented by a processing unit configured with configuration data stored on a non-transitory computer readable medium.

2. The method of claim 1, wherein the first and second RTL descriptions are first and second netlists.

3. The method of claim 1, wherein each logic component is associated with a corresponding one of the partitions before the merging.

4. The method of claim 1, further comprising: storing intermediate associations between the first logic components and the merged partitions; and wherein the comparing further comprises using the intermediate associations to identify the changed and unchanged partitions.

5. The method of claim 1, further comprising repeating the merging until a maximum partition size is reached and/or partition boundaries have not changed.

6. The method of claim 1, wherein the merging further comprises synthesizing the partitions to reduce a signal path between the first logic components.

7. The method of claim 1, wherein the merging further comprises synthesizing the partitions to reduce the area of the PLD used to implement the first design.

8. The method of claim 1, further comprising selectively merging at least a subset of the changed partitions of the second design before converting the changed partitions into the second physical implementations.

9. The method of claim 1, wherein the converting each partition comprises:
mapping the first logic components to PLD components; assigning the PLD components to physical locations of the PLD; and routing connections among the PLD components.

10. A system comprising:
a processor; and
a memory adapted to store a plurality of computer readable instructions which when executed by the processor are adapted to cause the system to perform a computer-implemented method comprising:
obtaining a first design comprising a first plurality of logic components, the first design comprising an RTL description;
selectively grouping the first plurality of logic components for the first design into a plurality of partitions;
selectively merging at least a subset of the partitions of the first design;
converting each partition into a corresponding first physical implementation for a programmable logic device (PLD);
obtaining a second design comprising a second plurality of logic components, the second design comprising an RTL description;
comparing the first plurality of logic components to the second plurality of logic components for the second design, the comparing comprising comparing the RTL descriptions of the first design and the second design, to identify changed and unchanged partitions between the first design and the second design.

11. The system of claim 10, wherein the method further comprises: receiving a first register transfer level (RTL) description identifying the first plurality of logic components for the first design; receiving a second RTL description identifying the second plurality of logic components for the second design; and wherein the comparing comprises comparing the first and second RTL descriptions.

12. The system of claim 11, wherein the first and second RTL descriptions are first and second netlists.

13. The system of claim 10, wherein each logic component is associated with a corresponding one of the partitions before the merging.

14. The system of claim 10, wherein the method further comprises: storing intermediate associations between the first logic components and the merged partitions; and wherein the comparing comprises using the intermediate associations to identify the changed and unchanged partitions.

15. The system of claim 10, wherein the method further comprises repeating the merging until a maximum partition size is reached and/or partition boundaries have not changed.

16. The system of claim 10, wherein the merging further comprises synthesizing the partitions to reduce a signal path between the first logic components.

17. The system of claim 10, wherein the merging further comprises synthesizing the partitions to reduce the area of the PLD used to implement the first design.

18. The system of claim 10, wherein the method further comprises selectively merging at least a subset of the changed partitions of the second design before converting the changed partitions into the second physical implementations.

19. A non-transitory machine-readable medium storing a plurality of machine-readable instructions which when executed by one or more processors of a computer system are adapted to cause the computer system to perform a computer-implemented method comprising:
obtaining a first design comprising a first plurality of logic components, the first design comprising an RTL description;
selectively grouping the first plurality of logic components for the first design into a plurality of partitions;
selectively merging at least a subset of the partitions of the first design;
converting each partition into a corresponding first physical implementation for a programmable logic device (PLD);
obtaining a second design comprising a second plurality of logic components, the second design comprising an RTL description;
comparing the first plurality of logic components to ffallthe second plurality of logic components for the second design, the comparing comprising comparing the RTL descriptions of the first design and the second design, to identify changed and unchanged partitions between the first design and the second design.

* * * * *